United States Patent
Royer

(10) Patent No.: US 9,955,620 B2
(45) Date of Patent: Apr. 24, 2018

(54) FORMATION OF EQUIPMENT FAMILIES ON FITTING LINES

(71) Applicant: SIEMENS AKTIENGESELLSCHAFT, München (DE)

(72) Inventor: Christian Royer, Ottobrunn (DE)

(73) Assignee: Siemens Aktiengesellschaft, München (DE)

( * ) Notice: Subject to any disclaimer, the term of this patent is extended or adjusted under 35 U.S.C. 154(b) by 282 days.

(21) Appl. No.: 14/413,224

(22) PCT Filed: Apr. 24, 2013

(86) PCT No.: PCT/EP2013/058524
§ 371 (c)(1),
(2) Date: Jan. 6, 2015

(87) PCT Pub. No.: WO2014/005742
PCT Pub. Date: Jan. 9, 2014

(65) Prior Publication Data
US 2015/0135505 A1    May 21, 2015

(30) Foreign Application Priority Data

Jul. 6, 2012   (DE) .................. 10 2012 211 810

(51) Int. Cl.
*H05K 13/08* (2006.01)
*G06Q 10/04* (2012.01)

(52) U.S. Cl.
CPC ............. *H05K 13/08* (2013.01); *G06Q 10/04* (2013.01); *Y10T 29/49826* (2015.01)

(58) Field of Classification Search
CPC ...... G06F 19/00; G06F 21/34; G06F 2217/12; H05K 3/30; H05K 3/301; H05K 3/303;
(Continued)

(56) References Cited

U.S. PATENT DOCUMENTS 5,127,554 A * 7/1992 Loychuk ............ B65D 83/0061
222/183
5,170,554 A * 12/1992 Davis ..................... H05K 13/08
29/832

(Continued)

FOREIGN PATENT DOCUMENTS

| CN | 102137589 A | 7/2011 |
| CN | 102356707 A | 2/2012 |

(Continued)

OTHER PUBLICATIONS

English translation of Japanese office Action for related Japanese Application No. 2015-518907 dated Aug. 29, 2016.

(Continued)

*Primary Examiner* — Carl Arbes
(74) *Attorney, Agent, or Firm* — Lempia Summerfield Katz LLC

(57) ABSTRACT

The invention concerns a fitting line which is arranged to fit printed circuit boards with electronic components. A method for determining equipment families for the fitting line comprises the following steps: initial forming of a number of equipment families, each having allocated printed circuit boards; selecting of one of the equipment families; and distributing of the printed circuit boards of the selected equipment family to the other equipment families by means of integral linear programming.

7 Claims, 4 Drawing Sheets

(58) Field of Classification Search
CPC .......... H05K 3/32; H05K 13/08; G06Q 10/04; Y10T 29/49826
See application file for complete search history.

(56) References Cited

U.S. PATENT DOCUMENTS

| | | | | |
|---|---|---|---|---|
| 5,258,915 | A * | 11/1993 | Billington | G06Q 10/04 700/103 |
| 5,838,567 | A * | 11/1998 | Boggio, Jr. | H05K 3/00 29/739 |
| 6,145,190 | A * | 11/2000 | Shin | H05K 13/0061 29/564.1 |
| 6,829,514 | B2 * | 12/2004 | Gyorfi | H05K 13/08 700/103 |
| 8,793,008 | B2 | 7/2014 | Bauer et al. | |
| 2004/0143352 | A1 * | 7/2004 | Gyorfi | H05K 13/08 700/99 |
| 2012/0004762 | A1 * | 1/2012 | Bauer | H05K 13/08 700/219 |

FOREIGN PATENT DOCUMENTS

| | | |
|---|---|---|
| DE | 102009013353 B3 | 10/2010 |
| JP | H04257968 A | 9/1992 |
| JP | H0754879 A | 2/1995 |
| JP | 2004265887 A | 9/2004 |
| WO | EP0478360 A1 | 4/1992 |
| WO | EP0478361 A1 | 4/1992 |

OTHER PUBLICATIONS

German Office Action for German Application No. 10 2012 211 810.1, dated Jun. 8, 2015 with English Translation.
English translation of Japanese Office Action for Japanese Application No. 2015-518907, dated Mar. 7, 2016.
Dino Luzzatto et al; "Cell Formation in PCB Assembly Based on Production Quantitative Data"; European Journal of Operational Research; vol. 69 No. 3; pp. 312-329; ISSN:0377-2217; DOI: 10.1016/0377-2217(93)90018-I; XP055085832; 1993; NL; Sep. 1, 1993.
PCT International Search Report and Written Opinion of the International Searching Authority dated Nov. 11, 2013 for corresponding PCT/EP2013/058524.
Chinese Office Action for related Chinese Application No. 201380036047.7 dated Oct. 10, 2016 with English Translation.

* cited by examiner

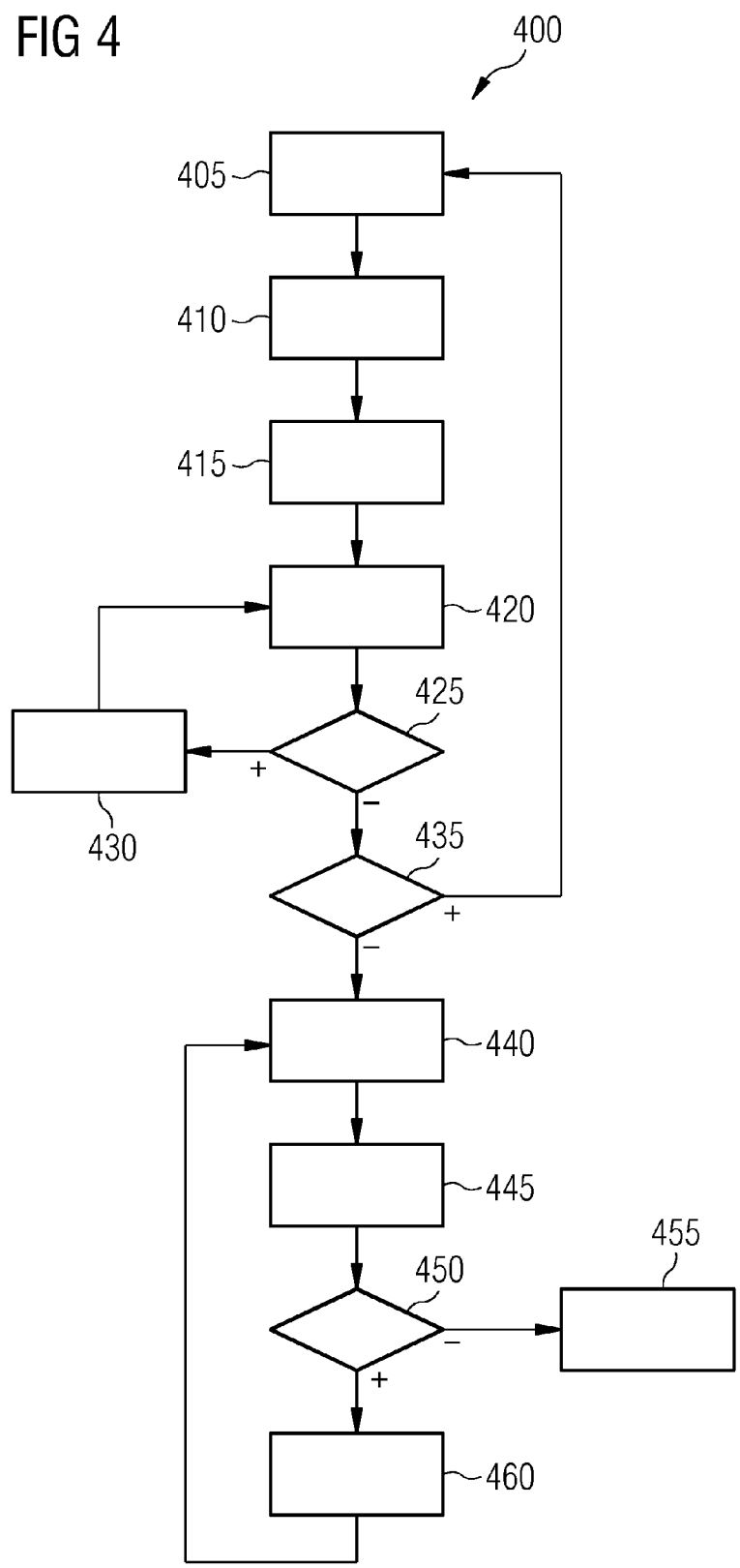

FORMATION OF EQUIPMENT FAMILIES ON FITTING LINES

This application is the National Stage of International Application No. PCT/EP2013/058524, filed Apr. 24, 2013, which claims the benefit of DE 10 2012 211 810.1, filed Jul. 6, 2012. The entire contents of these documents are hereby incorporated herein by reference.

BACKGROUND

The present embodiments relate to forming equipment families on fitting lines, and populating circuit boards with components.

In the field of electronics production, circuit boards or assemblies to be fabricated are manufactured on surface mounted technology (SMT) fitting lines by surface mounting.

DE 10 2009 013 353 B3 shows a method for setting up such a fitting line.

An equipment family is defined as a number of circuit boards that may be populated on one fitting line without changing the number of component types that are held ready at the fitting line for populating. Existing tools for determining equipment families frequently either require manual effort or do not always supply convincing results. Other known tools are tied for use with a particular fitting system.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved technique for assigning circuit boards to equipment families is provided.

A fitting line is set up for populating circuit boards with electronic components. A method according to one or more of the present embodiments for determining equipment families for the fitting line includes the initial formation of a number of equipment families having in each case assigned circuit boards, the selection of one of the equipment families, and the distribution of the circuit boards of the selected equipment family across the other equipment families by integer linear programming.

An equipment family is defined, for example, as a number of circuit boards that may be populated on a fitting line without changing the number of component types that are held ready at the fitting line for populating. The number of component types at the fitting line is also known as equipping. It may be assumed that a sufficiently large number of each component type is held ready at the fitting line.

The method allows a number of equipment families of the fitting line or of the fitting system to be reduced. As a result, equipping changeover may be arranged less frequently, so that production down-times required for equipping changeover may be avoided. In addition, the equipment families that are determined may better utilize existing supply apparatuses at the fitting line (e.g., a shuttle table or feed apparatus). A number of further supply apparatuses that are to be kept ready for the other equipment families of the fitting line may be reduced, whereby considerable costs may be saved. The method may be used with all conventional fitting lines.

In one embodiment, the equipment family having associated circuit boards that exhibit the smallest number of component types is selected for distribution across other equipment families. Each component type includes a large number of components that are indistinguishable from one another in the context of a fitting process on the fitting system. The number of component types of a circuit board or of an equipment family is also known as component variance. The number of component types may easily be determined, and the probability of being able to break up equipment families selected in this way may be high. The method may therefore converge quickly and lead to the determination of a small number of equipment families. In other embodiments, the equipment families that are to be distributed may also be determined based on other criteria, such as at random.

In one embodiment, equipment families are selected and distributed until no equipment families may any longer be distributed across the other equipment families. Through the use of an iterative method, the problem of the assignment of circuit boards to equipment families may be handled by a mixed integer program (MIP), for which standard solvers such as Ilog or Xpress exist. Such a solver may be used in an iterative manner to improve an intermediate solution of particular equipment families that has already been prepared. With each iteration, the number of equipment families may be reduced by at least one. With the improved performance capability of the standard solvers that may be expected in future, a determination speed of the method may increase further.

In one embodiment, the distribution includes the selection of at least one circuit board of an equipment family other than the one to be distributed, the prevention of a change to the existing assignment of the selected circuit boards to another equipment family, and the solution of the remaining problem of the formation of equipment families by integral linear programming.

This approach may, for example, be advantageous for larger problems with large numbers of circuit boards. Through the prevention of a change of the assignment of the selected circuit boards to other equipment families, the IP problem to be solved may be made smaller, so that a solution may be found more quickly. This reduction in size may be done iteratively until the problem is sufficiently small for the problem to be solved quickly, and with sufficient quality, by an MIP. The MIP may be interrupted when all circuit boards of the selected equipment family have been distributed across other equipment families, or until a time limit has been reached.

In one embodiment, the circuit board having a new assignment that is prevented is selected randomly. In another embodiment, a particular selection of the circuit board is made (e.g., based on the components with which the circuit board is to be populated, or a track usage of these components). A track usage is defined as the number of tracks of a supply apparatus of a fitting line that is provided to make the component available. Usual tracks are 8 mm wide, and one component may occupy one or more tracks.

The initial formation of an equipment family may be performed using a greedy method with respect to track usage. In one embodiment, a circuit board having assigned component types that make up all together the largest track usage is selected, and the selected circuit board is assigned to a newly created equipment family. The remaining circuit boards are analyzed for the cut set of the component types with which the remaining circuit boards are to be populated with the component types of the previously created equipment family. Out of these, the circuit board with components of the cut set that have the largest track usage is determined.

If the selected circuit board still fits into the equipment family, the selected circuit board is assigned to the new equipment family. The circuit board may, for example, fit into the equipment family if the component types of the resulting equipment family may still simultaneously be held ready by the supply apparatus of the fitting line.

By way of the described procedure, an initial number of equipment families representing an initial solution may be found in a fast and efficient manner, and may rapidly be refined into a high-quality solution in iterative passes through the method described at the beginning. The initial solution determined may, as a result of the "greedy" approach described, already exhibit a good quality, so that potentially less effort is to be applied to optimization in the subsequent process.

In one embodiment, with the initial formation of the equipment family described, further circuit boards are iteratively selected and assigned to the equipment family until no more circuit boards fit into the equipment family.

In one embodiment, new equipment families are formed, and circuit boards are assigned to the equipment families that have been formed until all the circuit boards to be populated are assigned to an equipment family. The initial formation of the number of equipment families may in this way be carried out quickly and efficiently.

A computer program product according to one or more of the present embodiments includes program code for carrying out the described method when run on an execution equipment or is stored on a computer-readable medium (e.g., a non-transitory computer-readable storage medium). The computer program product may be prepared in one of the usual programming languages (e.g., C++, Java). The processing apparatus may be a commercially standard computer (e.g., including one or more processors) or a server with appropriate input, output and storage device.

A control apparatus (e.g., a computer) according to one or more of the present embodiments for the determination of equipment families for a fitting line for populating circuit boards with electronic components is configured to carry out the method described above.

BRIEF DESCRIPTION OF THE DRAWINGS

FIG. 4 shows a flow diagram of one embodiment of an optimization process on the fitting system of FIG. 1.

DETAILED DESCRIPTION

Linear optimization is one of the main methods in the field of mathematical optimization, and is concerned with the optimization of linear objective functions across a set that is constrained by linear equalities and inequalities. The linear optimization is the foundation of the solution method of integer linear optimization (e.g., mixed).

Advantages of linear optimization are a global approach to optimization, that linear optimization is easily extendable, very good commercial standard solvers (SCIP, CPLEX, Ilog, Xpress) that are widely used and proven in praxis are available, and a maximum distance (e.g., gap) of a solution that has been found from the optimum solution is known.

Figure 1:
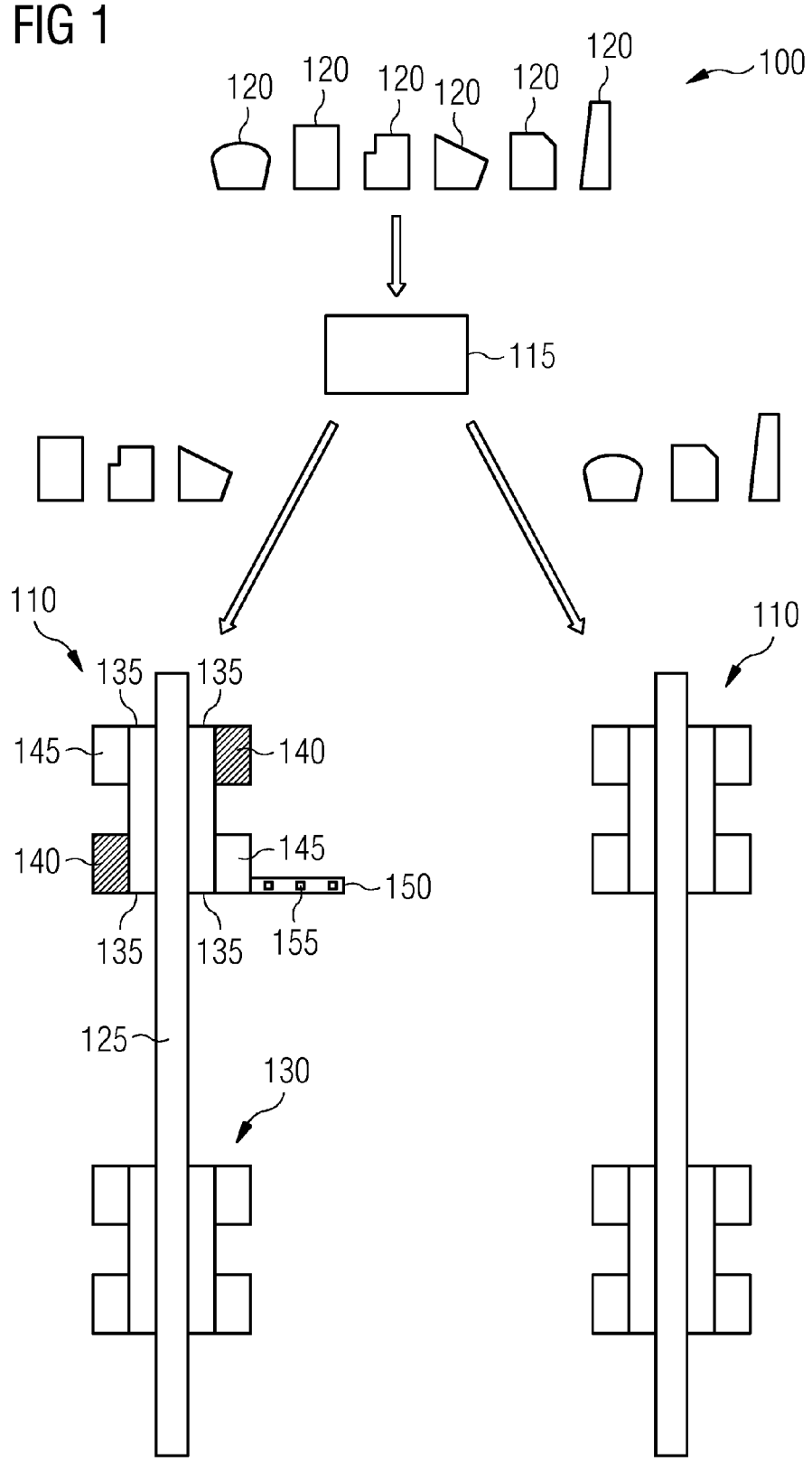
FIG. 1 shows one embodiment of a fitting system.

FIG. 1 shows one embodiment of a fitting system 100. The fitting system 100 includes a plurality of fitting lines 110 and a control apparatus 115 for assigning circuit boards 120 to the fitting lines 110. Each fitting line 110 may include a transport system 125 and one or more fitting machines 130. Each fitting machine 130 includes one or more fitting heads 135. Each of the one or more fitting heads 135 is configured to pick components up from a constant table 140 or from a variable table 145 and position the components at a pre-specified position on the circuit board 120, which is located in the transport system 125.

During the fitting process, the circuit board 120 may remain stationary with respect to the fitting machine 130. The tables 140, 145 each include a large number of feed apparatuses 150, of which only one is shown by way of example. Each feed apparatus 150 contains a supply of components 155 of a prespecified type. Each feed apparatus 150 may be configured to hold ready different components 155, and different feed apparatuses 150 are attached to one table 140, 145. For reasons of speed, the tables 140, 145 may be completely replaced when a fitting machine 130 has to be supplied with components 155 that are not held ready in one of the attached tables 140, 145.

Since such a changeover may be associated with production down-time, an effort is made to keep the number of tables 140, 145 to be exchanged small. If a table is not replaced during a re-equipping procedure, the table is referred to as a constant table 140. Otherwise, the table is referred to as a variable table 145. There are no other functional differences between a constant table 140 and a variable table 145.

The circuit board 120 is to be populated with a number of different components 155. In order to minimize a frequent exchange of variable tables 145, and, for example, to maximize a number of constant tables 140, the control apparatus 115 is configured to optimize the assignment of a circuit board 120 to a fitting line 110. Specific properties of each fitting line 110 or of each fitting machine 130 may be taken into account just as much as the properties of the circuit boards 120 or of the components 155 with which the circuit boards 120 are to be populated.

Figure 2:
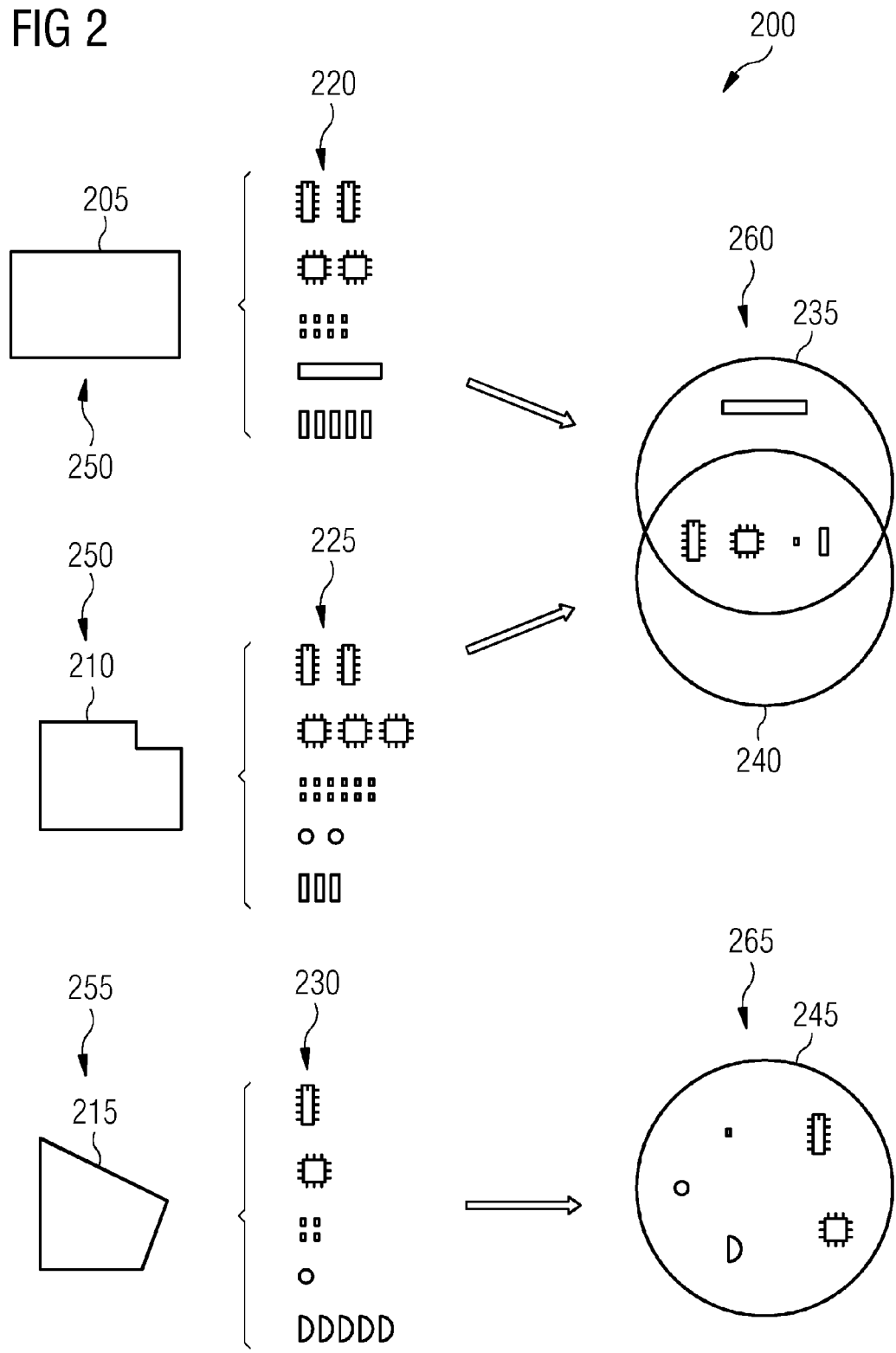
FIG. 2 shows an illustration of exemplary equipment families on the fitting system of FIG. 1.

FIG. 2 shows an illustration 200 of equipment families (e.g., "clusters"). A first circuit board 205, a second circuit board 210 and a third circuit board 215 are shown. Each of the first circuit board 205, the second circuit board 210, and the third circuit board 215 corresponds to one of the circuit boards 120 in the fitting system 100 of FIG. 1. A first set 220 of components 155 are to be fitted on the first circuit board 205, a second set 225 of component 155 are to be fitted on the second circuit board 210, and a third set 230 of components 155 are to be fitted on the third circuit board 215. By way of example, each of the sets 220 to 230 includes five different component types, of which in each case, components 155 are used in different numbers. The sets 220 to 230 of components 155 are therefore assigned sets 235 to 245 of component types. Each of the different components 155 of the corresponding sets 220 to 230 only occurs once again in the sets 235 to 245.

An equipment family includes the circuit boards 120 that are assigned to a fitting line 100 for population. In the example of FIG. 2, the circuit boards 205 and 210 are assigned to the same fitting line 110 and form a first equipment family 250. The first equipment family 250 therefore uses first equipment 260 with component types of the union of sets 235 and 240 that are assigned to circuit boards 205 or 210. In the illustrated example, the first equipment 260 includes six types of component. With the provision of the component types of the first equipment 260, circuit boards 205 and 210 of the first equipment family 250 may be populated without setting up the fitting line 110 again.

The third circuit board 215 is assigned to another fitting line 110, and by itself forms a second equipment family 255. A second equipment 265 assigned to the second equipment family 255 includes five component types.

If the third circuit board 215 were to be assigned to the same equipment family as circuit boards 205 and 210, then the equipment assigned to the resulting equipment family would contain the union set of the component types of sets 235 to 245, which in the present example, would be seven component types. If the fitting line 110 only has the capacity to accept six different types of component 155, then the equipment family formed in this way may not be assigned to the fitting line 110 (e.g., the third circuit board 215 no longer fits into the equipment family assigned to the fitting line 110).

Figure 3:
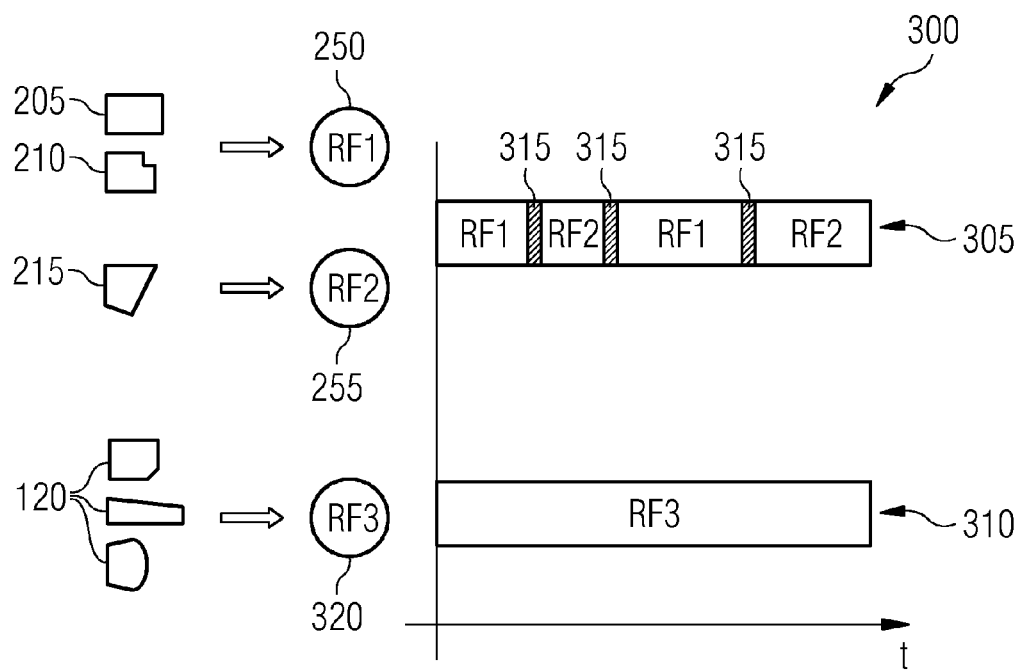
FIG. 3 shows an illustration of an exemplary assignment of equipment families to fitting lines on the fitting system of FIG. 1.

FIG. 3 shows an illustration 300 of an exemplary assignment of equipment families 250, 255 to fitting lines 110 in the fitting system 100 of FIG. 1. The illustration is based on the example given in FIG. 2.

The first equipment family 250 and the second equipment family 255 of FIG. 2 are assigned to a first fitting line 305. The equipment families 250 and 255 are set up in alternation on the fitting line 110, where one equipment changeover 315 is provided for each change.

A third equipment family 320 is assigned to a second fitting line 310. The third equipment family 320 is permanently assigned to the second fitting line 310, and re-equipping the second fitting line 310 again does not occur in the illustrated example.

An attempt is made to assign the circuit boards 120 to the equipment families 250, 255, 320 such that in each case the largest possible number of different circuit boards 120 may be populated. However, more circuit boards 120 may be assigned to a fitting line 110 than may be included within one equipment family, since an arbitrary number of component types may not be held ready at the fitting line 110. The fitting line 110 is therefore subjected to an equipment changeover from time to time, in which the equipment for a first equipment family is changed over for the equipment for a second equipment family. The less frequent these equipment changeovers are, and the smaller the number of component types that are to be changed at an equipment changeover, the more economically the fitting system may be operated.

In order to keep the frequency with which the fitting line 305 is set up again as low as possible, an attempt is made to reduce the number of equipment families 250, 255 of the fitting line 110 as far as possible. In one embodiment, an attempt is also made to form the equipment families 250, 255 such that not too many types of component are to be changed over at an equipment changeover 315. The number of variable tables 145 at the fitting line 110 may thus be reduced, and the number of constant tables 140 may be increased. In the formation of equipment families 250, 255, for technical reasons under some circumstances, not every component 155 on a circuit board 120 may be processed on every fitting line 110.

The formation of equipment families 250, 255 320 for the individual fitting lines 305, 310 will be explained in more detail below with reference to FIG. 4.

FIG. 4 shows a flow diagram of one embodiment of a method 400 for the optimized assignment of circuit boards 120 to equipment families 250, 255, 320. In a first segment of the method 400, a greedy method for the initial formation of a number of equipment families 250, 255, 320 is carried out in acts 405 to 435. Other partial methods for the formation of the equipment families 250, 255, 320 may also be provided. The equipment families 250, 255, 320 determined serve as the initial solution for a second segment of the method 400, which reduces the number of the equipment families 250, 255, 320 in acts 440 to 460.

In act 405, an equipment family 250, 255, 320 is generated.

In act 410, from among the circuit boards 120 that are present and are still to be assigned, the circuit boards 120 that exhibit the largest track usage are selected. The components 155 of each circuit board 120 each use one or more tracks in which the constant tables 140 and the variable tables 145, as well as the feed apparatus 155, are organized. The components 155 of one component type may exhibit track usages of different sizes.

In act 415, the circuit board 120 that has been determined is assigned to the new equipment family 250, 255, 320 determined in act 405.

In act 420, a further circuit board 120 is then selected. The rule applying to the selected circuit board 120 is that the selected circuit board 120 has the largest track usage of the component types that are in the cut set of the component types of the selected circuit board 120 with those of the new equipment family.

In another embodiment, the circuit board 120 that, if assigned in act 405 to the created equipment family 240, 255, 320, increases track usage the least is selected.

In act 425, a check is made as to whether the selected further circuit board fits into the equipment family 250, 255, 320. This is the case if, after the assignment of the further circuit board to the equipment family 250, 255, 320, the component types of the equipment family 250, 255, 320 may be fully loaded into the feed apparatus 140, 145 150 of the fitting line 110.

In act 430, if the test yields a positive result, then in act 430, the further circuit board 120 is assigned to the equipment family 250, 255, 320, and the method 500 continues with act 420 described above.

In act 435, if, however, the test yields a negative result, then a check is made in act 435 as to whether further circuit boards 120 that are not yet assigned to any equipment family 250, 255, 320 are present. If this is the case, then the method 400 branches back to act 405 in order to generate a new equipment family 250, 255, 320.

The initial solution that was determined, including all the equipment families 250, 255 320 determined up to this point, is then improved iteratively.

In act 440, for this purpose, one of the equipment families 250, 255, 320 that has been determined is selected in order to distribute the circuit boards 120 that have been assigned to the one equipment family across the other equipment families. In one embodiment, the equipment family 250, 255, 320 having assigned circuit boards 120 that include the smallest number of component types is selected. Alternatively, a different selection criterion may be applied (e.g., which equipment family 250, 255, 320 exhibits the lowest track usage).

In act 445, using integer linear programming (MIP) based on the applicable solution (e.g., all the equipment families 250, 255, 320 that have been determined), an attempt is made to distribute the circuit boards 120 of the equipment family 250, 255, 320 that was selected in act 440, across the other equipment families 250, 255, 320. This act may be performed using a standard solver. The integral linear programming may also take additional restrictions into account. For example, particular components 155 may only be held in readiness at prespecified tables 140, 145, perhaps for reasons of size or properties. In one embodiment, the fitting line 110 may only be stocked with a certain maximum number of components 155. In addition, a portion of the circuit boards 120 may always be assigned to the same equipment family 250, 255, 320. This is, for example, appropriate when an upper side and a lower side of the same circuit board 120 are being populated. Finally, circuit boards 120 may be identified that have to be assigned to different equipment families 250, 255, 320.

In act 450, a check is made as to whether a distribution of circuit boards 120 to equipment families 250, 255, 320 in which the previously selected equipment family 250, 255, 320 is empty may be found.

In act 455, if this is not the case, the method 400 terminates in act 455.

In one variant, the determination of the solution by integral linear programming in act 455 may also be performed iteratively. Some circuit boards 120 in the present solution are fixed in assignment to an equipment family 250, 255, 320, whereas the assignment of others may be varied. The integral linear programming is then performed based on this solution, whereby one or more new solutions are determined. A criterion is formed for each solution found, indicating the quality of the solution. Solutions having a criterion that indicates an inadequate quality are then rejected. The remaining solutions may then be further improved in one or more further passes of the integer linear programming. This iteration may be interrupted when a solution with a prespecified quality is found, or when a prespecified determination time has elapsed.

In act 460, if, in act 455, the circuit boards 120 of at least one equipment family 250, 255, 320 may be distributed to other equipment families 250, 255, 320, then all the empty equipment families 250, 255, 320 are determined and removed from the existing solution. In the event of successful distribution of the selected equipment family 250, 255, 320, this is at least one, but may also be more. The method 400 returns to act 440 for a new pass.

Following this determination, further circuit boards 120 may iteratively be permanently assigned to their current equipment family 250, 255, 320 in order to further reduce the problem for an integer linear programming. An abortion of this iteration may be made when the resulting problem is sufficiently small in order to permit useful handling by the standard solvers. After a sufficiently large number of circuit boards 120 have been determined, the above described 455 may be carried out.

Mathematical Background

By way of the application of exact mathematical methods, significantly better solutions may be achieved than with the heuristics previously used in practice. In a further difference therefrom, good production times may also be achieved with this method.

Indices
R Number of circuit boards 120
C Number of component types 155
Cl Number of equipment families 250, 255, 320
$R_c$ Number of circuit boards with component type c
Parameters
$Time_{r,l}$ Total production time for the circuit board r on line l
$TimeLimit_l$ Production time limit on line l
Binary Variables $Assign_{r,cl}$ Assignment of circuit board r to equipment family cl
$Setup_{r,cl}$ Use of a component c in equipment family cl
IP Formulation $$\text{minimize} \sum_{c \in C} Setup_{c,cl'}$$

where cl' is the equipment family that is to be distributed across other equipment families such that:

$$\sum_{cl \in Cl} Assign_{r,cl} = 1 \qquad r \in R$$

$$\sum_{r \in R_c} Assign_{r,cl} \leq |R_c| Setup_{c,cl} \quad c \in C, cl \in Cl$$

$$\sum_{c \in C_c} Width_c Setup_{c,cl} \leq Cap_{cl} \quad cl \in Cl$$

$$Setup_{c,cl} \in \{0, 1\} \qquad c \in C, cl \in Cl$$

$$Assign_{r,cl} = \{0, 1\} \qquad r \in R, cl \in Cl$$

Although the invention is more closely illustrated and described in more detail by way of the exemplary embodiments, the invention is not restricted by the disclosed examples. Other variations may be derived by a person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determination of equipment families for a fitting line for populating circuit boards with electronic components, the method comprising:
   initially forming, by a processor, a plurality of equipment families;
   assigning, by the processor, circuit boards to each equipment family of the plurality of equipment families, wherein the circuit boards for each equipment family of the plurality of equipment families have one or more associated component types and a track usage;
   selecting one equipment family of the plurality of equipment families;
   distributing, by the processor, the circuit boards of the selected one equipment family across the other equipment families of the plurality of equipment families by integer linear programming, wherein each equipment family of the plurality of equipment families is a respective group of circuit boards that are populatable on the fitting line without changing a number of component types that are held ready at the fitting line for populating, and wherein initially forming the plurality of equipment families comprises:

selecting a circuit board having assigned component types that exhibit a largest track usage as compared to the track usage of circuit boards associated with the plurality of equipment families;

assigning the selected circuit board to another equipment family of the plurality of equipment families, or wherein selecting one equipment family of the plurality of equipment families comprises selecting one equipment family of the plurality of equipment families having assigned circuit boards with a smallest number of component types as compared to the number of component types of assigned circuit boards of the other equipment families of the plurality of equipment families.

2. The method of claim 1, wherein the selecting of the one equipment family of the plurality of equipment families and the distributing of the circuit boards of the selected one equipment family are repeated until every equipment family of the plurality of equipment families has been selected and distributed.

3. The method of claim 1, wherein the distributing further comprises:

selecting at least one circuit board of an equipment family of the plurality of equipment families other than the one equipment family to be distributed;

preventing a change to the existing assignment of the at least one selected circuit board to another equipment family of the plurality of equipment families; and solving the remaining problem by integer linear programming.

4. The method of claim 3, wherein the at least one circuit board is selected at random.

5. The method of claim 1, wherein further circuit boards are selected and assigned until no more circuit boards fit any longer into the equipment family.

6. The method of claim 1, further comprising:

forming one or more additional equipment families, and assigning circuit boards to the one or more additional equipment families until all the circuit boards are assigned to an equipment family.

7. The method of claim 1, wherein the selecting of the one equipment family and the assigning of the circuit boards are repeated until there are no more unassigned circuit boards.

* * * * *